(12) United States Patent
Yi et al.

(10) Patent No.: US 11,164,840 B2
(45) Date of Patent: Nov. 2, 2021

(54) CHIP INTERCONNECTION STRUCTURE, WAFER INTERCONNECTION STRUCTURE AND METHOD FOR MANUFACTURING THE SAME

(71) Applicant: Wuhan Xinxin Semiconductor Manufacturing Co., Ltd., Hubei (CN)

(72) Inventors: Hongsheng Yi, Hubei (CN); Guoliang Ye, Hubei (CN); Jiaqi Wang, Hubei (CN)

(73) Assignee: Wuhan Xinxin Semiconductor Manufacturing Co., Ltd., Hubei (CN)

( * ) Notice: Subject to any disclaimer, the term of this patent is extended or adjusted under 35 U.S.C. 154(b) by 58 days.

(21) Appl. No.: 16/582,441

(22) Filed: Sep. 25, 2019

(65) Prior Publication Data
US 2021/0020596 A1 Jan. 21, 2021

(30) Foreign Application Priority Data

Jul. 18, 2019 (CN) .......................... 201910651652.4

(51) Int. Cl.
*H01L 23/00* (2006.01)
*H01L 21/78* (2006.01)
(Continued)

(52) U.S. Cl.
CPC .............. *H01L 24/32* (2013.01); *H01L 21/78* (2013.01); *H01L 24/08* (2013.01); *H01L 24/29* (2013.01);
(Continued)

(58) Field of Classification Search
CPC ......... H01L 24/32; H01L 24/08; H01L 24/94; H01L 25/0657; H01L 2225/06548; H01L 21/78
See application file for complete search history.

(56) References Cited

U.S. PATENT DOCUMENTS 9,236,412 B2  1/2016 Okamoto
9,319,569 B2  4/2016 Umebayashi et al.
(Continued)

FOREIGN PATENT DOCUMENTS

CN  101840925 A  9/2010
CN  102751234 A  10/2012
(Continued)

OTHER PUBLICATIONS

First Chinese Office Action regarding Application No. 201910651652.4 dated Dec. 2, 2019. English translation provided by Unitalen Attorneys at Law.

*Primary Examiner* — Quoc D Hoang
(74) *Attorney, Agent, or Firm* — Harness, Dickey & Pierce, P.L.C.

(57) ABSTRACT

A chip structure, a wafer structure and a method for manufacturing the same are provided in the present disclosure. A first chip and a second chip are bonded by bonding layers of a dielectric material. Top wiring layers are led out through bonding via holes from a back surface of a bonded chip. The bonding via holes are used for bonding and are surrounded by the bonding layers. A top wiring layer of a third chip is led out through bonding pads formed in a bonding layer. The bonding via holes are aligned with and bonded to the bonding pads to achieve bonding of the three chips. The top wiring layer of the third chip is led out from the back surface of the third chip through a lead-out pad.

15 Claims, 4 Drawing Sheets

(51) Int. Cl.
*H01L 25/065* (2006.01)
*H01L 25/18* (2006.01)
*H01L 25/00* (2006.01)

(52) U.S. Cl.
CPC .............. *H01L 24/83* (2013.01); *H01L 24/94* (2013.01); *H01L 25/0657* (2013.01); *H01L 25/18* (2013.01); *H01L 25/50* (2013.01); *H01L 2224/05025* (2013.01); *H01L 2224/05082* (2013.01); *H01L 2224/05147* (2013.01); *H01L 2224/05573* (2013.01); *H01L 2224/05624* (2013.01); *H01L 2224/29187* (2013.01); *H01L 2224/32146* (2013.01); *H01L 2224/32501* (2013.01); *H01L 2224/83896* (2013.01); *H01L 2225/06548* (2013.01); *H01L 2924/04642* (2013.01); *H01L 2924/05042* (2013.01); *H01L 2924/05442* (2013.01); *H01L 2924/1431* (2013.01); *H01L 2924/1434* (2013.01)

(56) References Cited

U.S. PATENT DOCUMENTS

| | | |
|---|---|---|
| 9,379,159 B2 | 6/2016 | Qian et al. |
| 9,431,448 B2 | 8/2016 | Okamoto |
| 9,451,131 B2 | 9/2016 | Umebayashi et al. |
| 9,455,158 B2 | 9/2016 | Tsai et al. |
| 9,530,812 B2 | 12/2016 | Umebayashi et al. |
| 9,748,308 B2 | 8/2017 | Qian et al. |
| 9,754,990 B2 | 9/2017 | Okamoto |
| 9,799,695 B2 | 10/2017 | Umebayashi et al. |
| 9,941,249 B2 | 4/2018 | Tsai et al. |
| 10,141,361 B2 | 11/2018 | Umebayashi et al. |
| 10,224,234 B2 | 3/2019 | Okamoto |
| 10,403,670 B2 | 9/2019 | Umebayashi et al. |
| 10,431,565 B1 * | 10/2019 | Kim ................. H01L 25/50 |
| 2004/0014308 A1 | 1/2004 | Kellar et al. |
| 2010/0238331 A1 | 9/2010 | Umebayashi et al. |
| 2011/0113339 A1 | 5/2011 | Lee et al. |
| 2012/0267740 A1 | 10/2012 | Okamoto |
| 2014/0042299 A1 | 2/2014 | Wan et al. |
| 2015/0348905 A1 | 12/2015 | Tsai et al. |
| 2015/0365567 A1 | 12/2015 | Umebayashi et al. |
| 2016/0086997 A1 | 3/2016 | Okamoto |
| 2016/0111468 A1 | 4/2016 | Qian et al. |
| 2016/0211298 A1 | 7/2016 | Okamoto |
| 2016/0218134 A1 | 7/2016 | Umebayashi et al. |
| 2016/0268333 A1 | 9/2016 | Qian et al. |
| 2016/0379963 A1 | 12/2016 | Tsai et al. |
| 2017/0092681 A1 | 3/2017 | Umebayashi et al. |
| 2017/0236745 A1 | 8/2017 | Okamoto |
| 2018/0012924 A1 | 1/2018 | Umebayashi et al. |
| 2018/0076249 A1 | 3/2018 | Umebayashi et al. |
| 2018/0175476 A1 * | 6/2018 | Teshiba ............... H01L 25/18 |
| 2019/0115323 A1 * | 4/2019 | Haba ............... H01L 25/0657 |
| 2019/0198387 A1 | 6/2019 | Okamoto |
| 2019/0214425 A1 | 7/2019 | Umebayashi et al. |

FOREIGN PATENT DOCUMENTS

| | | |
|---|---|---|
| CN | 105280611 A | 1/2016 |
| CN | 105529341 A | 4/2016 |
| CN | 109148415 A | 1/2019 |

* cited by examiner

CHIP INTERCONNECTION STRUCTURE, WAFER INTERCONNECTION STRUCTURE AND METHOD FOR MANUFACTURING THE SAME

The present application claims priority to Chinese Patent Application No. 201910651652.4, titled "CHIP STRUCTURE, WAFER STRUCTURE AND METHOD FOR MANUFACTURING THE SAME", filed on Jul. 18, 2019 with the China National Intellectual Property Administration, which is incorporated herein by reference in its entirety.

FIELD

The present disclosure relates to the technical field of semiconductor devices and manufacture thereof, and in particular, to a chip structure, a wafer structure and a method for manufacturing the chip structure and the wafer structure.

BACKGROUND

With continuous development of semiconductor technology, the 3D-IC (three-dimensional integrated circuit) technology has been widely used, in which the wafer-level packaging technology is applied to stack and bond various wafers together. The 3D-IC technology has advantages of high performance, low cost and high integration. In the wafer-level packaging technology, connection structure is the key factor, which affects both the processing speed and the performance of a device.

SUMMARY

In view of the above, there are provided a chip structure, a wafer structure and a method for manufacturing the chip structure and the wafer structure, in which an interconnection structure is simple and short in length, thereby improving the performance of a device.

The chip structure includes:

a first chip and a second chip, where a front surface of the first chip is covered with a first bonding layer of a firs dielectric material, a front surface of the second chip is covered with a second bonding layer of a second dielectric material, and the first bonding layer is bonded to the second bonding layer;

a third bonding layer of a third dielectric material covering a back surface of the second chip;

bonding via holes including a first bonding via hole extending from the third bonding layer to a first top wiring layer of the first chip and a second bonding via hole extending from the third bonding layer to a second top wiring layer of the second chip;

a third chip, where the third chip includes a third top wiring layer, a fourth boding layer and bonding pads, where the fourth boding layer is made of a fourth dielectric material and is arranged on the third top wiring layer and convers a front surface of the third chip, each of the bonding pads extends through the fourth bonding layer and is connected to the third top wiring layer, and the third bonding layer is bonded to the fourth bonding layer, and the bonding via holes are bonded to the bonding pads; and a lead-out pad extending from a back surface of the third chip to the third top wiring layer.

In some embodiments, each of a first device of the first chip, a second device of the second chip, and a third device of the third chip includes one or more of a memory device, a sensor device and a logic device.

In some embodiments, a material of the first bonding layer, the second bonding layer, the third bonding layer or the fourth bonding layer is one or more of silicon oxide, silicon nitride and nitrogen doped silicon carbide (NDC).

In some embodiments, each of the bonding pads includes a wiring hole and a via hole on top of the wiring hole.

In some embodiments, a material of the bonding pads is copper, and a material of sidewalls of the bonding via holes is copper.

In some embodiments, a material of the lead-out pad is aluminum.

The wafer structure includes a wafer bonding structure, where the wafer bonding structure includes a first wafer, a second wafer, and a third wafer that are stacked in sequence. Multiple above chip structures are arranged in an array on the wafer bonding structure.

A method for manufacturing a bonding structure includes:

providing a first wafer and a second wafer, where a front surface of the first wafer is covered with a first bonding layer of a first dielectric material, and a front surface of the second wafer is covered with a second bonding layer of a second dielectric material;

bonding the second wafer to the first wafer via the first bonding layer and the second bonding layer;

covering a third bonding layer of a third dielectric material on a back surface of the second wafer; forming bonding via holes including a first bonding via hole extending from the third bonding layer to a first top wiring layer of the first wafer and a second bonding via hole extending from the third bonding layer to a second top wiring layer of the second wafer;

providing a third wafer, where the third wafer includes a third top wiring layer, a fourth boding layer and bonding pads, where the fourth boding layer is made of a fourth dielectric material and is arranged on the third top wiring layer and convers a front surface of the third wafer, each of the bonding pads extends through the fourth bonding layer and is connected to the third top wiring layer;

bonding the third wafer to the second wafer via the third bonding layer and the fourth bonding layer, where the bonding via holes are bonded to the bonding pads; and forming a lead-out pad extending from a back surface of the third wafer to the third top wiring layer, to obtain a wafer bonding structure.

In some embodiments, each of a first device in the first wafer, a second device in the second wafer, and a third device in the third wafer includes one or more of a memory device, a sensor device and a logic device.

In some embodiments, the method further includes: cutting the wafer bonding structure to obtain separated chip structures.

In the chip structure, the wafer structure and the method for manufacturing the chip structure and the wafer structure according to embodiments of the present disclosure, a stacked structure is adopted, which includes three chips. A first chip and a second chip are bonded by bonding layers of dielectric materials. Top wiring layers are led out through banding via holes from a back surface of a bonded chip. The banding via holes are used for bonding and are surrounded by the bonding layers. A top wiring layer of a third chip is led out through a bonding pad formed in a bonding layer. The bonding via holes are aligned with and bonded to the bonding pads to achieve bonding of the three chips. Furthermore, the top wiring layer of the third chip is led out from a back surface of the third chip through a lead-out pad. In the stacked structure, the first chip and the second chip are bonded and led out through the bonding via holes, which are aligned with and bonded to the bonding pads on the third chip, and the top wiring layer of the third chip is led out from the back surface of the third chip, thereby forming an interconnection structure of the stacked chip that is simple in structure and short in length, which effectively improves transmission efficiency and performance of the device.

BRIEF DESCRIPTION OF THE DRAWINGS

For clearer illustration of the technical solutions according to embodiments of the present disclosure or conventional techniques, hereinafter are briefly described the drawings to be applied in embodiments of the present disclosure or conventional techniques. Apparently, the drawings in the following descriptions are only some embodiments of the present disclosure, and other drawings may be obtained by those skilled in the art based on the provided drawings without creative efforts.

DETAILED DESCRIPTION OF EMBODIMENTS

In order to make the above objects, features and advantages of the present disclosure clearer, the embodiments of the present disclosure will be described in detail below with reference to the drawings.

Many specific details are set forth in the following description in order to provide a thorough understanding of the present disclosure, but the present disclosure may be practiced otherwise. A person skilled in the art can make similar embodiments without departing from the spirit of the present disclosure, and thus the present disclosure is not limited by the specific embodiments disclosed below.

Further, the present disclosure will be described in detail in conjunction with the drawings. In the detailed description of the embodiments of the present disclosure, the cross-sectional view of the structure of the device is partially enlarged not in proportion. The schematic diagram is only used for illustration, and the scope of protection of the present disclosure should not be limited hereto. In addition, the actual three-dimensional dimensions of length, width and depth should be included in the actual production.

As described in the Background, in the wafer-level packaging technology, the connection structure is the key factor, which affects both the processing speed and the performance of the device.

To this end, in the present disclosure, there are provided a chip structure, a wafer structure and a method for manufacturing the chip structure and the wafer structure, to simplify the connection structure of a stacked structure including three chips. In the stacked structure, a first chip and a second chip are bonded and led out through bonding via holes, which are aligned with and bonded to bonding pads on a third chip, and a top wiring layer of the third chip is led out from a back surface of the third chip, thereby forming an interconnection structure of the stacked chips, which is simple in structure and short in length, thereby effectively improving the transmission efficiency and performance of the device.

Figure 1:
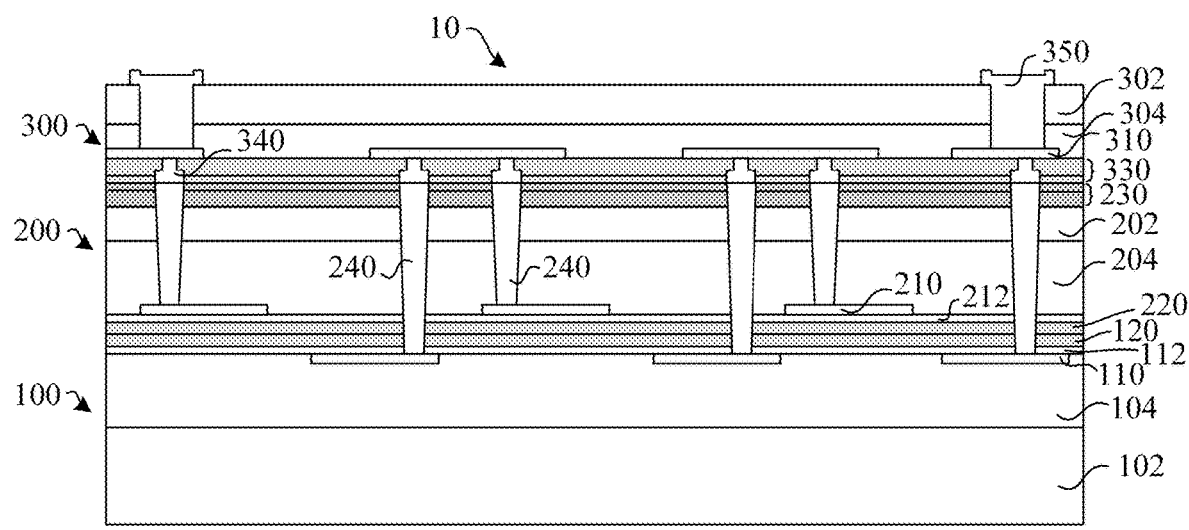
FIG. 1 is a schematic cross-sectional view of a chip structure according to an embodiment of the present disclosure.

Referring to FIG. 1, a chip structure 10 is provided, including a first chip 100 and a second chip 200. A front surface of the first chip 100 is covered with a first bonding layer 120 of a first dielectric material, and a front surface of the second chip 200 is covered with a second bonding layer 220 of a second dielectric material. The first bonding layer 120 is bonded to the second bonding layer 220.

The chip structure 10 further includes a third bonding layer 230 of a third dielectric material covering a back surface of the second chip 200.

The chip structure 10 further includes bonding via holes 240 including a first bonding via hole extending from the third bonding layer 230 to a first top wiring layer 110 of the first chip 100 and a second bonding via hole extending from the third bonding layer 230 to a second top wiring layer 210 of the second chip 200.

The chip structure 10 further includes a third chip 300. The third chip 300 includes a third top wiring layer 310, a fourth boding layer 330 and bonding pads 340. The fourth boding layer 330 is made of a fourth dielectric material and is arranged on the third top wiring layer 310 and convers a front surface of the third chip 300. Each bonding pad 340 extends through the fourth bonding layer 330 and is connected to the third top wiring layer 310. The third bonding layer 230 is bonded to the fourth bonding layer 330, and the bonding via holes 240 are bonded to the bonding pads 340.

The chip structure 10 further includes a lead-out pad 350 extending from a back surface of the third chip 300 to the third top wiring layer 310.

The first chip 100, the second chip 200, and the third chip 300 are each formed with a device and an interconnection structure electrically connected to the device, where the device is formed on the substrate. In some embodiments of the present disclosure, the device may include a MOS (Metal-Oxide Semiconductor) device, a sensor device, a memory device, and/or a passive device. The sensor device may be, for example, a photosensitive device or the like. The memory device may include a non-volatile memory or a random access memory or the like. The non-volatile memory may include, for example, a floating gate field effect transistor such as a NOR type flash memory or a NAND type flash memory, or may include a ferroelectric memory, a phase change memory, or the like. The passive device may include, for example, a resistor, a capacitor, or the like. The device may be a planar device or a three-dimensional device. The three-dimensional device may be, for example, a FIN-FET (Fin Field Effect Transistor), a three-dimensional memory, or the like. The device may be covered by a layer of dielectric material, which may be in a stacked structure, and may include an inter-layer dielectric layer, an inter-metal dielectric layer, and the like. The interconnection structure is formed in the dielectric material. The interconnection structure may include a contact plug, a via hole, or a wiring layer. The wiring layer may include one or more layers. The interconnection structure may be made of a metal material such as tungsten, aluminum, copper, or the like. The substrate may be a semiconductor substrate, such as a Si substrate, a Ge substrate, a SiGe substrate, an SOI (Silicon On Insulator) substrate or a GOI (Germanium On Insulator) substrate.

In some embodiments, the first chip 100 includes a first substrate 102, a first device and a first interconnection structure, where the first device and the first interconnection structure are formed on the first substrate 102. The first device is covered by a first cover layer 104 of a dielectric material. The first interconnection structure is formed in the first cover layer 104. The first top wiring layer 110 is the topmost connection layer of the first interconnection structure.

The second chip 200 includes a second substrate 202, a second device and a second interconnection structure, where the second device and the second interconnection structure are formed on the second substrate 202. The second device is covered by a second cover layer 204 of a dielectric material. The second interconnection structure is formed in the second cover layer 204. The second top wiring layer 210 is the topmost connection layer of the second interconnection structure.

The third chip 300 includes a third substrate 302, a third device and a third interconnection structure, where the third device and the third interconnection structure are formed on the third substrate 302. The third device is covered by a third cover layer 304 of a dielectric material. The third interconnection structure is formed in the third cover layer 304. The third top wiring layer 310 is the topmost connection layer of the third interconnection structure.

In embodiments of the present disclosure, each chip may include one or more devices. The chips may have the same or different devices. The different devices may be of different types or may be of the same type but have different operating voltages. For example, the first device may be a memory device, the second device may be a memory device, and the third device may be a MOS device. By the bonding, the surface area of the chip is greatly reduced while the storage space is increased, thereby improving the integration degree of the chip. For another example, the first device may be a memory device, the second device may be a sensor device, and the third device may be a MOS device, so as to implement storage, sensing and processing in an integrated chip having a small area, thereby improving the integration degree of the chip.

It should be noted that, in the drawings of the embodiments of the present disclosure, the device structure in each chip is not shown, and only the top wiring layer in the interconnection structure is shown. In addition, for convenience of description, the two surfaces of the chip are respectively described as the front surface of the chip and the back surface of the chip, the front surface of the chip is the side of the substrate on which the device and the interconnection structure are formed, and the back surface of the chip is the side opposite to the front surface, that is, the back surface of the substrate.

The first bonding layer 120 and the second bonding layer 220 are further formed on the front surface of the first chip 100 and the second chip 200, respectively. The first chip 100 and the second chip 200 are bonded together by the two bonding layers, and a bonding interface is formed between the first bonding layer 120 and the second bonding layer 220. The first bonding layer 120 and the second bonding layer 220 each may be made in a single layer structure or a stacked structure, and are made of a same bonding dielectric material or different bonding dielectric materials, including, for example, one or more of silicon oxide, silicon nitride, or nitrogen doped silicon carbide (NDC). In an embodiment, both the first bonding layer 120 and the second bonding layer 220 may be made of silicon oxide.

A first diffusion barrier layer 112 may be arranged between the first bonding layer 120 and the layer including the first top wiring layer 110, and a second diffusion barrier layer 212 may be arranged between the second bonding layer 220 and the layer including the second top wiring layer 210. These diffusion barrier layers serve to block the diffusion of metal atoms, such as copper atoms, in the top wiring layer.

The back surface of the second chip 230 is further covered with a third bonding layer 230 of a dielectric material. The third bonding layer 230 may be made in a single layer structure or a stacked structure of a bonding dielectric material including one or more of silicon oxide, silicon nitride or NDC. In an embodiment, the third bonding layer 230 may include a bonding silicon oxide layer and an NDC layer which are sequentially stacked, where the NDC layer has a better bonding performance.

The first chip 100 and the second chip 200 that are bonded by their front surfaces are provided with bonding via holes 240 respectively extending to the first top wiring layer 110 in the first chip 100 and the second top wiring layer 210 in the second chip 200. The bonding via holes 240 are used for bonding and also used for connection to the first top wiring layer 110 and the second top wiring layer 210. The bonding via holes 240 extend through the second substrate 202. In an embodiment, the second substrate 202 is a silicon substrate, and the bonding via holes 240 are also referred to as silicon via holes.

The material of the bonding via holes 240 is a conductive material for bonding, such as copper. An insulating layer (not shown) is further formed on a sidewall of each bonding via hole 240 for isolating from the second substrate 202. In some embodiments of the present disclosure, the bonding via hole 240 for the first top wiring layer 110 extends through the second substrate 202 and the bonding layers 120, 220 from the third bonding layer 230 to the surface of the first top wiring layer 110, and the bonding via hole 240 for the second top wiring layer 210 extends through the second substrate 202 from the third bonding layer 230 to the surface of the second top wiring layer 210.

The fourth bonding layer 330 is further arranged on the layer including the third top wiring layer 310 on the front surface of the third chip 300. The fourth bonding layer 330 may be made in a single layer structure or a stacked structure of a bonding dielectric material including one or more of silicon oxide, silicon nitride and NDC. In an embodiment, the fourth bonding layer 330 may include a bonding silicon oxide layer and an NDC layer which are sequentially stacked, where the NDC layer has a better bonding performance.

In the fourth bonding layer 330, the bonding pads 340 are further provided, which are made of a conductive material for bonding, such as copper. The bonding pads 340 are arranged on the third top wiring layer 310. The interconnection structure in the third chip 300 is led out to the front surface of the third chip 300 by the contact connection between the bonding pads 340 and the top wiring layer 310. In an embodiment, each bonding pad 340 may be in a damascene structure including a wiring hole and a via hole on top of the wiring hole. The via hole has a larger diameter than the wiring hole. The wiring hole is in contact with the third top wiring layer 310 to lead out the third top wiring layer 310. The via hole is in direct communication with the wiring hole. The via hole has a larger contact surface than the wiring hole, which facilitates bonding.

In the embodiment of the present disclosure, the front surface of the third chip 300 is bonded to the back surface of the second chip 200, and the bonding pads 340 are aligned with and bonded to the bonding via holes 240. The bonding pads 340 are surrounded by the third bonding layer 230. The bonding via holes 240 are surrounded by the fourth bonding layer 330. The third bonding layer 230 and the fourth bonding layer 330 are also bonded together. A bonding interface is formed between the third bonding layer 230 and the fourth bonding layer 330 and between the bonding via holes 240 and the bonding pads 340.

The lead-out pad 350 extending to the third top wiring layer 310 is arranged on the back surface of the third chip 300. The lead-out pad 350 is in contact with the third top wiring layer 310 for leading out the interconnection structure in the chip structure 10. The lead-out pad 350 is made of a conductive material, such as aluminum. An insulating layer may be arranged on the back surface of the third chip 300. The lead-out pad 350 may extend through the insulating layer and the third substrate 302 to reach the third top wiring layer 310. The sidewall of the lead-out pad 350 also has an insulating layer for insulating from the third substrate 303.

In the bonding structure stacked on the front surfaces of the first chip 100 and the second chip 200, by the bonding via holes 240 being in contact with the first top wiring layer 110 and the second top wiring layer 210 respectively, the interconnection structures in the first chip 100 and the second chip 200 are led out to the back surface of the second chip 200. In this case, the interconnection structure of the third chip 300 can be connected to the interconnection structures of the first chip 100 and the second chip 200 by the alignment and bonding between the bonding pads 340 and the bonding via holes 240. Further, an interconnection structure in which the first chip 100, the second chip 200 and the third chip 300 are connected together is led out from the back surface of the third chip 300 by the contact connection between the lead-out pad 350 and the third top wiring layer 310, thereby realizing the interconnection of the stacked chips. The interconnection structure is simple in structure and short in length, which effectively improves transmission efficiency and performance of the device.

Figure 2:
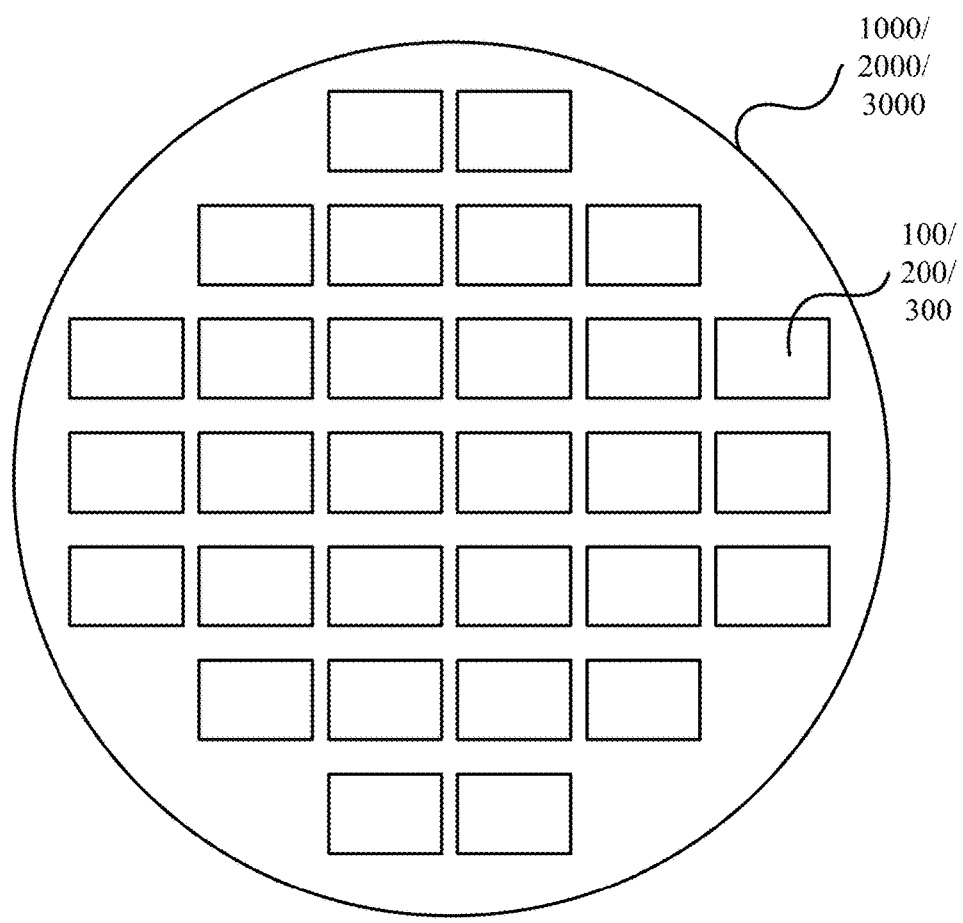
FIG. 2 is a schematic top view of wafers in a wafer structure according to an embodiment of the present disclosure.

The chip structures are described in detail according to the above embodiments of the present disclosure. In addition, a wafer structure is provided in the embodiments of the present disclosure. The wafer includes a wafer bonding structure. The wafer bonding structure includes a first wafer, a second wafer and a third wafer that are stacked in sequence, and multiple above chip structures 10 are arranged in an array on the wafer bonding structure. Reference is made to FIG. 2, which is a schematic top view of the wafers in the wafer structure according to an embodiment of the present disclosure. Multiple above first chips 100 are arranged in an array on the first wafer 1000, multiple above second chips 200 are arranged in an array on the second wafer 2000, and multiple above third chips 300 are arranged in an array on the third wafer 3000. In the wafer bonding structure formed by bonding the wafers 1000, 2000 and 3000, the chip structures 10 are also arranged in an array.

In addition, a method for manufacturing the above-described wafer structure and chip structure are also provided in the present disclosure, which will be described in detail below with reference to FIGS. 3 to 8. FIGS. 3 to 8 are schematic cross-sectional views of partial structures formed in a method of manufacturing a wafer structure according to an embodiment of the present disclosure.

Figure 3:
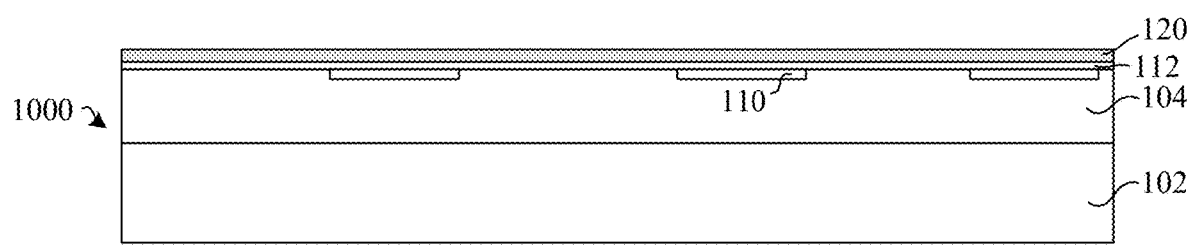
FIGS. 3 to 8 are schematic cross-sectional views of partial structures formed in a method of manufacturing a wafer structure according to an embodiment of the present disclosure.
Figure 4:
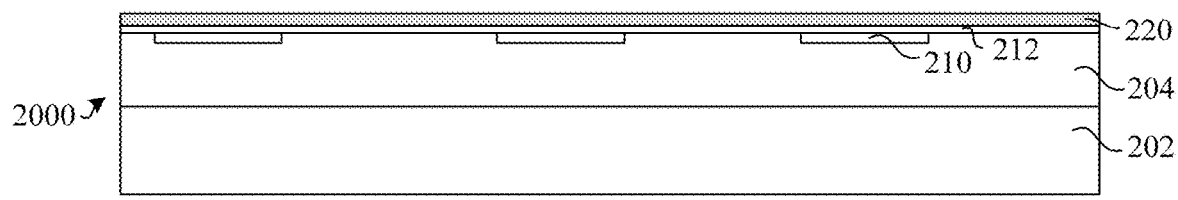

In step S01, a first wafer 1000 and a second wafer 2000 are provided, where a front surface of the first wafer 1000 is covered with a first bonding layer 120 of a first dielectric material, and a front surface of the second wafer 2000 is covered with a second bonding layer 220 of a second dielectric material, as shown in FIG. 3 and FIG. 4.

In the present disclosure, the first wafer 1000 and the second wafer 2000 are already formed with devices therein. Referring to FIG. 3, a first device is formed on the first substrate 102 of the first wafer 1000. The first device is covered with a first cover layer 104. A first interconnection structure is formed in the first cover layer 104, where the first top wiring layer 110 is the uppermost connection layer in the first interconnection layer. Referring to FIG. 4, a second device is formed on the second substrate 202 of the second wafer 2000. The second device is covered with a second cover layer 204. A second interconnection structure is formed in the second cover layer 204, where the second top wiring layer 210 is the uppermost connection layer in the second interconnection layer.

In an embodiment, after the devices are formed in the first wafer 1000 and the second wafer 2000, a first diffusion barrier layer 112 and a first bonding layer 120 may be sequentially deposited on the front surface of the first wafer 1000. In an embodiment, the first diffusion barrier layer 112 may be made of silicon nitride, and the first bonding layer 120 may be made of silicon oxide. A second diffusion barrier layer 212 and a second bonding layer 220 may be sequentially deposited on the front surface of the second wafer 2000. In an embodiment, the second diffusion barrier layer 212 may be made of silicon nitride, the second bonding layer 220 may be made of silicon oxide, and the first substrate and the second substrate may be silicon substrates.

Figure 5:
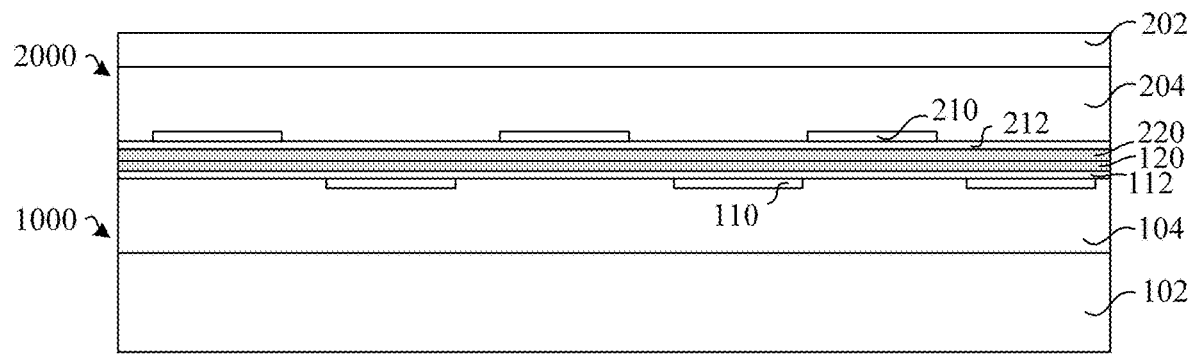

In step S02, the second wafer 2000 is bonded to the first wafer 1000 via the first bonding layer 120 and the second bonding layer 220, as shown in FIG. 5.

In an embodiment, the second bonding layer 220 of the second wafer 2000 is placed to face the first bonding layer 120 of the first wafer 1000 to perform alignment of the two wafers, and the front surfaces of the first wafer 1000 and the second wafer 2000 are bonded together via a bonding device. After the bonding, a bonding interface of the two wafers is formed between the first bonding layer 120 and the second bonding layer 220.

After the bonding, the second substrate 202 may be thinned from the back side of the second wafer 2000, which may be performed by multiple processes. In an embodiment, a grinding process may be performed first for rough grinding, and then a chemical mechanical planarization process or a wet etching process may be performed for further thinning to obtain the target thickness.

Figure 6:
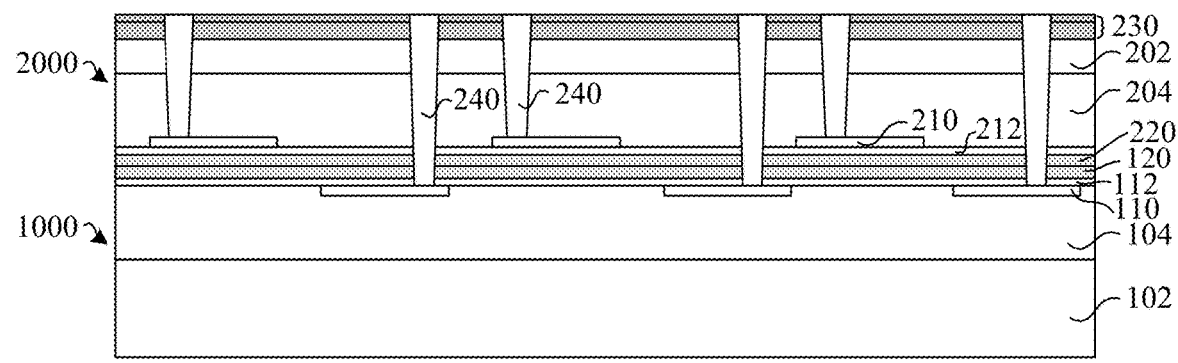

In step S03, a back surface of the second wafer 2000 is covered with a third bonding layer 230 of a third dielectric material, and a first bonding via hole 240 extending from the third bonding layer 230 to a first top wiring layer 110 of the first wafer 1000 and a second bonding via hole 240 extending from the third bonding layer 230 to a second top wiring layer 210 of the second wafer 2000 are formed, as shown in FIG. 6.

In an embodiment, the third bonding layer 230 may be formed by sequentially depositing a silicon oxide layer and a NDC layer. Then a mask layer is formed on the third bonding layer 230 by a photolithography process. Then, silicon via holes respectively extending to the first top wiring layer 110 and the second top wiring layer 210 may be formed in the third bonding layer 230 by multiple etching processes. Then, a layer of copper is electroplated and planarized on sidewalls of the silicon via holes to form bonding via holes 240.

Figure 7:
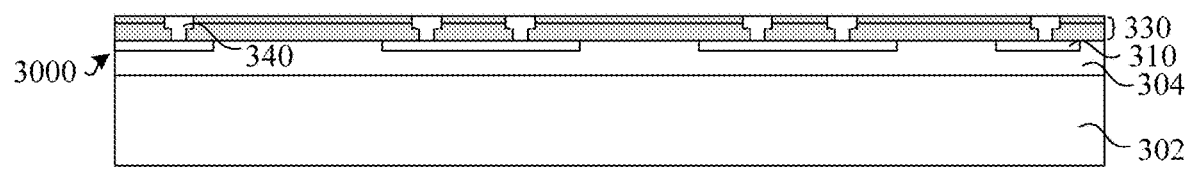

In step S04, a third wafer 3000 is provided, where the third wafer 3000 includes a third top wiring layer 310, a fourth boding layer 330 and bonding pads 340. The fourth boding layer 330 is made of a fourth dielectric material and is arranged on the third top wiring layer 310 and convers a front surface of the third wafer 3000. Each bonding pad 340 extends through the fourth bonding layer 330 and is connected to the third top wiring layer 310, as shown in FIG. 7.

The third wafer 3000 is already formed with a device therein. Referring to FIG. 7, a third device is formed on a third substrate 302 of the third wafer 3000. The third device is covered with a third cover layer 304. A third interconnection structure is formed in the third cover layer 304. The third top wiring layer 310 is the uppermost connection layer in the third interconnection structure.

In an embodiment, after the device processing process is completed on the third wafer 3000, the fourth bonding layer 330 is formed on the front surface of the third wafer 3000 by sequentially depositing a silicon oxide layer and a NDC layer. A protective layer of silicon oxide (not shown) may be further deposited on the fourth bonding layer 330, to protect the surface of the fourth bonding layer 330 from damage during the subsequent process of forming the bonding pads. Then, a via hole extending to the third top wiring layer 310 may be formed in the fourth bonding layer 330 by an etching process. The via hole may be in a damascene structure. Thereafter, a layer of copper is electroplated and planarized until the protective layer is removed, thereby forming a bonding pad 340 including a wiring hole and a via hole on top of the wiring hole, as shown in FIG. 7.

Figure 8:
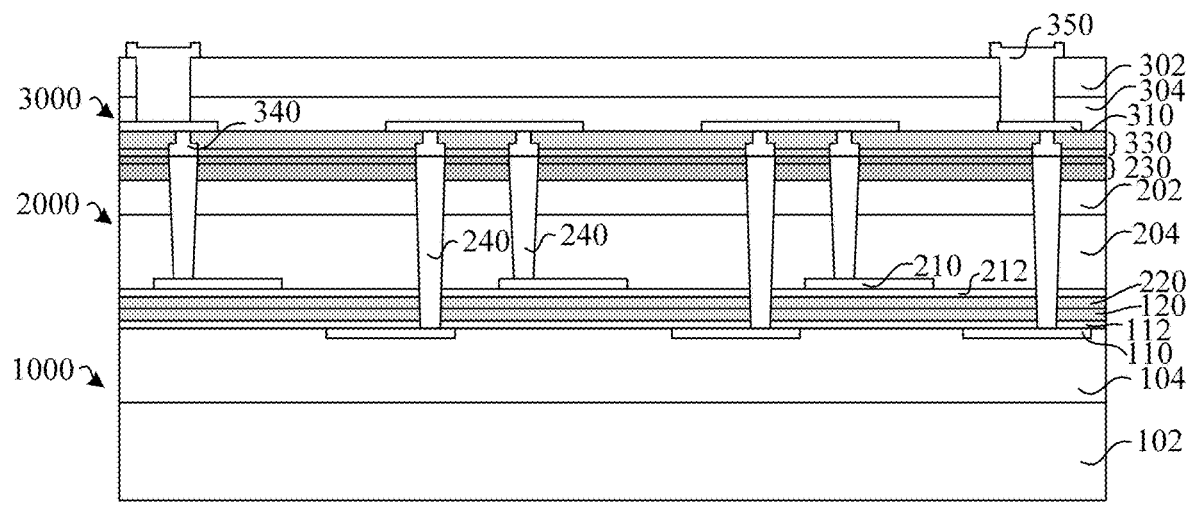

In step S05, the third wafer 3000 is bonded to the second wafer 2000 via the third bonding layer 230 and the fourth bonding layer 330, where the bonding via holes 240 are bonded to the bonding pads 340, as shown in FIG. 8.

In an embodiment, the fourth bonding layer 330 of the third wafer 3000 may be placed to face the third bonding 230 of the second wafer 2000 to perform alignment of the two wafers, so that the bonding via holes 240 are accurately aligned with the bonding pads 340. Then, the front surface of the third wafer 3000 is bonded to the back surface of the second wafer 2000 via a bonding device. A bonding interface between the third bonding layer 230 and the fourth banding layer 330 is formed after the bonding.

After the bonding, the third substrate 302 may be thinned from the back side of the third wafer 3000, and the thinning process may be performed by multiple processes.

In step S06, a lead-out pad 350 extending from the back surface of the third wafer 3000 to the third top wiring layer 310 is formed, to obtain a wafer bonding structure, as shown in FIG. 8.

In an embodiment, an insulating layer of silicon oxide may be formed on the back surface of the third wafer 3000, and then a mask layer is formed on the insulating layer by a photolithography process, and an etching process is performed to form an opening extending to the third top wiring layer 310. Then, an aluminum thin film may be deposited and etched to form the lead-out pad 350.

By the above method, the wafer structure according to the embodiment of the present disclosure is formed. Then, as shown in FIG. 2, the wafer bonding structure may be cut along scribe lines, thereby obtaining separated chip structures.

The embodiments of the present disclosure are described in a progressive manner, and each embodiment places emphasis on the difference from other embodiments. Therefore, the embodiments may be referred to each other for the same or similar parts. Since the wafer structure and the manufacturing method correspond to the chip structure, the descriptions thereof are relatively simple, and reference may be made to the relevant part of the description of the chip structure.

The foregoing embodiments are only preferred embodiments of technical solutions in the present disclosure. The preferred embodiments are disclosed above, but they are not intended to limit the present disclosure. With the method and technical content disclosed above, those skilled in the art can make some variations and improvements to the technical solutions of the present disclosure, or make some equivalents on the embodiments without departing from the scope of technical solutions of the present disclosure. All simple modifications, equivalent variations and improvements made based on the technical essence of the present disclosure without departing from the content of the technical solutions of the present disclosure fall within the protection scope of the technical solutions of the present disclosure.

The invention claimed is:

1. A chip interconnection structure, comprising:
    a first chip and a second chip, wherein a front surface of the first chip is covered with a first bonding layer of a first dielectric material, a front surface of the second chip is covered with a second bonding layer of a second dielectric material, and the first bonding layer is bonded to the second bonding layer;
    a third bonding layer of a third dielectric material covering a back surface of the second chip;
    bonding via holes, comprising a first bonding via hole extending from a top surface of the third bonding layer to a first top wiring layer of the first chip and a second bonding via hole extending from the top surface of the third bonding layer to a second top wiring layer of the second chip, wherein the top surface of the third bonding layer is a surface facing away the back surface of the second chip;
    a third chip, comprising a third top wiring layer, a fourth bonding layer and bonding pads, wherein the fourth bonding layer is made of a fourth dielectric material and is arranged on the third top wiring layer and covers a front surface of the third chip, each of the bonding pads extends through the fourth bonding layer and is connected to the third top wiring layer, the third bonding layer is bonded to the fourth bonding layer, and the bonding via holes are bonded to the bonding pads; and
    a lead-out pad extending from a back surface of the third chip to the third top wiring layer.

2. The chip interconnection structure according to claim 1, wherein each of a first device of the first chip, a second device of the second chip, and a third device of the third chip comprises one or more of a memory device, a sensor device and a logic device.

3. The chip interconnection structure according to claim 1, wherein each of the first dielectric material, the second dielectric material, the third dielectric material and the fourth dielectric material comprises one or more of silicon oxide, silicon nitride and nitrogen doped silicon carbide (NDC).

4. The chip interconnection structure according to claim 1, wherein each of the bonding pads comprises a wiring hole and a via hole on top of the wiring hole.

5. The chip interconnection structure according to claim 4, wherein a material of the bonding pads is copper, and a material of sidewalls of the bonding via holes is copper.

6. The chip interconnection structure according to claim 1, wherein a material of the lead-out pad is aluminum.

7. A wafer interconnection structure, comprising:
    a wafer bonding structure comprising a first wafer, a second wafer, and a third wafer that are stacked in sequence, wherein a plurality of chip structures are arranged in an array on the wafer bonding structure, wherein each of the chip structures comprises:

a first chip and a second chip, wherein a front surface of the first chip is covered with a first bonding layer of a first dielectric material, a front surface of the second chip is covered with a second bonding layer of a second dielectric material, and the first bonding layer is bonded to the second bonding layer;

a third bonding layer of a third dielectric material covering a back surface of the second chip;

bonding via holes, comprising a first bonding via hole extending from a top surface of the third bonding layer to a first top wiring layer of the first chip and a second bonding via hole extending from the top surface of the third bonding layer to a second top wiring layer of the second chip, wherein the top surface of the third bonding layer is a surface facing away the back surface of the second chip;

a third chip, comprising a third top wiring layer, a fourth bonding layer and bonding pads, wherein the fourth bonding layer is made of a fourth dielectric material and is arranged on the third top wiring layer and covers a front surface of the third chip, each of the bonding pads extends through the fourth bonding layer and is connected to the third top wiring layer, the third bonding layer is bonded to the fourth bonding layer, and the bonding via holes are bonded to the bonding pads; and a lead-out pad extending from a back surface of the third chip to the third top wiring layer.

8. The wafer interconnection structure according to claim 7, wherein each of a first device of the first chip, a second device of the second chip, and a third device of the third chip comprises one or more of a memory device, a sensor device and a logic device.

9. The wafer interconnection structure according to claim 7, wherein each of the first dielectric material, the second dielectric material, the third dielectric material and the fourth dielectric material comprises one or more of silicon oxide, silicon nitride and nitrogen doped silicon carbide (NDC).

10. The wafer interconnection structure according to claim 7, wherein each of the bonding pads comprises a wiring hole and a via hole on top of the wiring hole.

11. The wafer interconnection structure according to claim 10, wherein a material of the bonding pads is copper, and a material of sidewalls of the bonding via holes is copper.

12. The wafer interconnection structure according to claim 7, wherein a material of the lead-out pad is aluminum.

13. A method for manufacturing a bonding structure, comprising:

providing a first wafer and a second wafer, wherein a front surface of the first wafer is covered with a first bonding layer of a first dielectric material, and a front surface of the second wafer is covered with a second bonding layer of a second dielectric material;

bonding the second wafer to the first wafer via the first bonding layer and the second bonding layer;

covering a third bonding layer of a third dielectric material on a back surface of the second wafer;

forming bonding via holes comprising a first bonding via hole extending from a top surface of the third bonding layer to a first top wiring layer of the first wafer and a second bonding via hole extending from the top surface of the third bonding layer to a second top wiring layer of the second wafer, wherein the top surface of the third bonding layer is a surface facing away the back surface of the second chip;

providing a third wafer, wherein the third wafer comprises a third top wiring layer, a fourth bonding layer and bonding pads, wherein the fourth bonding layer is made of a fourth dielectric material and is arranged on the third top wiring layer and covers a front surface of the third wafer, each of the bonding pads extends through the fourth bonding layer and is connected to the third top wiring layer;

bonding the third wafer to the second wafer via the third bonding layer and the fourth bonding layer, wherein the bonding via holes are bonded to the bonding pads; and forming a lead-out pad extending from a back surface of the third wafer to the third top wiring layer, to obtain a wafer bonding structure.

14. The method according to claim 13, wherein each of a first device in the first wafer, a second device in the second wafer, and a third device in the third wafer comprises one or more of a memory device, a sensor device and a logic device.

15. The method according to claim 13, further comprising:

cutting the wafer bonding structure to obtain separated chip structures.

* * * * *